(12) United States Patent
Mueller-Hipper et al.

(10) Patent No.: US 8,448,868 B2
(45) Date of Patent: May 28, 2013

(54) SMART CARD MODULE WITH FLIP-CHIP-MOUNTED SEMICONDUCTOR CHIP

(75) Inventors: Andreas Mueller-Hipper, Regensburg (DE); Frank Pueschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 127 days.

(21) Appl. No.: 12/940,062

(22) Filed: Nov. 5, 2010

(65) Prior Publication Data

US 2011/0108629 A1    May 12, 2011

(30) Foreign Application Priority Data

Nov. 6, 2009  (DE) .......................... 10 2009 052 160

(51) Int. Cl.
*G06K 19/06*     (2006.01)
(52) U.S. Cl.
USPC .......................................... 235/488; 235/492
(58) Field of Classification Search
USPC ........................ 235/488, 492, 486, 487, 449
See application file for complete search history.

(56) References Cited

U.S. PATENT DOCUMENTS

| | | | |
|---|---|---|---|
| 6,049,055 A * | 4/2000 | Fannash et al. | 219/121.66 |
| 6,303,471 B1 | 10/2001 | Unno et al. | |
| 6,817,534 B2 | 11/2004 | Gray | |
| 6,853,087 B2 * | 2/2005 | Neuhaus et al. | 257/778 |
| 2007/0057796 A1 | 3/2007 | Craig et al. | |
| 2007/0132094 A1 * | 6/2007 | Shimura et al. | 257/729 |
| 2009/0057914 A1 * | 3/2009 | McDonald-Maier et al. | 257/777 |
| 2011/0108629 A1 * | 5/2011 | Mueller-Hipper et al. | 235/488 |

FOREIGN PATENT DOCUMENTS

| | | |
|---|---|---|
| DE | 20021698 U1 | 5/2001 |
| DE | 19954941 C2 | 11/2003 |
| DE | 102006047761 A1 | 4/2008 |

* cited by examiner

*Primary Examiner* — Thien M Le
(74) *Attorney, Agent, or Firm* — Slater & Matsil, L.L.P.

(57) ABSTRACT

A smart card module and a method for producing a smart card module are provided. The smart card module comprises a semiconductor chip having a contact side with a plurality of contacts, and a base material with at least one metal layer. The contact side of the semiconductor chip faces the base material and the plurality of contacts of the semiconductor chip are electrically connected to the metal layer. The semiconductor chip and at least a portion of the base material are covered with an encapsulation layer.

23 Claims, 1 Drawing Sheet

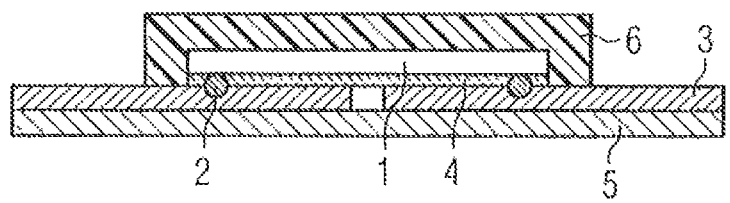
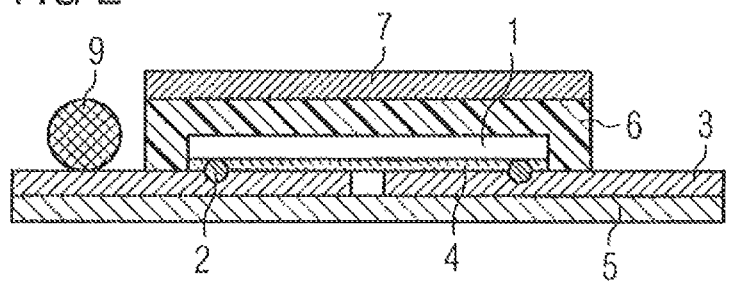
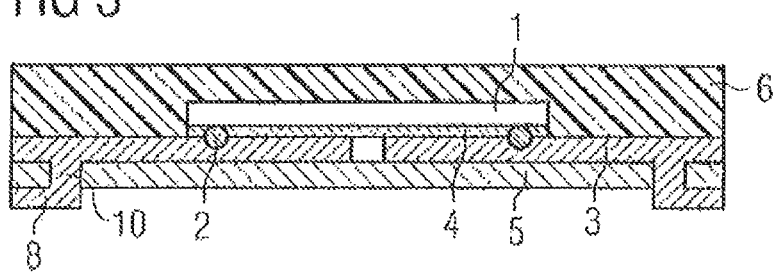
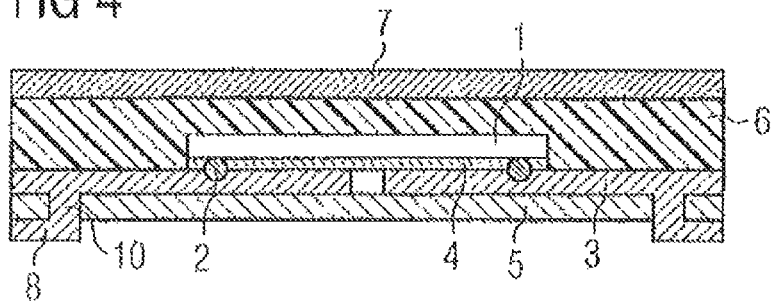

SMART CARD MODULE WITH FLIP-CHIP-MOUNTED SEMICONDUCTOR CHIP

REFERENCE TO RELATED APPLICATIONS

This application claims the benefit of the priority date of German application DE 102009052160.7 filed on Nov. 6, 2009, the content of which is herein incorporated by reference.

TECHNICAL FIELD

The present invention relates generally to a smart card module with a flip-chip-mounted semiconductor chip. In particular, the present invention relates to a thin, robust, and cost effective smart card module with a flip-chip-mounted semiconductor chip.

BACKGROUND

In many areas of electronics, sensor technology and microsystems engineering, the production requirements result in an urge towards miniaturization and increase in productivity by joining together subsystems in more highly integrated structures. The trend towards more highly integrated and compact designs that can be used, for example, in smart cards, has already led to the use of components which are arranged directly on the modules. Such modules are, for example, contactless modules of the known type series MCC2, MOA2 or MCC. In these modules, the integrated circuit or the chip is contact-connected by means of so-called wire bonds and is encapsulated by a plastic molding material. For structural reasons, this type of integration leads to a larger overall module thickness and makes integration into a smart card module more difficult.

Known contactless smart card modules, such as the MFCC1 module, have chips that are contact-connected to NiAu contacts by flip-chip mounting. In flip-chip mounting, the chip is mounted with the active contact-making side facing downward towards the substrate or circuit carrier. As a result, there is no need for the chip to be covered. Consequently, the total thickness of the smart card module is determined solely by the chip thickness. However, such a contactless smart card module is highly susceptible to mechanical loading and has little flexibility in the stiffness of the module due to the small chip thickness.

Another known method of mounting the chip is frame adhesive bonding. A desired stabilization or stiffening of the module may be achieved through this method. In frame adhesive bonding, a chip is adhesively bonded to the leadframe before further processing. However, the adhesive affects the total thickness of the module. In addition, delamination may occur between the chip and the leadframe.

Another known method is to adhesively bond the chip onto a steel plate having a thickness of approximately 120 µm. However, the active surface of the chip remains unprotected and, during further processing, an antenna has to be directly applied onto the chip in order to be contact-connected to the module. Therefore, a need exists for a smart card module that is thin and robust as well as cost-effective.

BRIEF DESCRIPTION OF DRAWINGS

FIGS. 1 and 2 show a smart card module in accordance with one embodiment of the present disclosure.

FIGS. 3 and 4 show a smart card module in accordance with another embodiment of the present disclosure.

SUMMARY OF INVENTION

The present disclosure provides a smart card module and a method for producing the same. In one embodiment, the smart card module comprising a base material with at least one metal layer, a semiconductor chip disposed over the base material, the semiconductor chip having a contact side with a plurality of contacts, wherein the plurality of contacts are electrically connected to the at least one metal layer, and an encapsulating layer disposed over the semiconductor chip and at least a portion of the base material and the at least one metal layer.

In another embodiment, a method for producing a smart card module is provided. The method comprises providing a base material with at least one metal layer, disposing a semiconductor chip having a plurality of contacts over the at least one metal layer of the base material, and encapsulating the semiconductor chip and at least a portion of the at least one metal layer and the base material with an encapsulation layer.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact elements which allow electrical contact to be made with the semiconductor chips. The contact elements may be composed of any desired electrically conductive material, for example, of a metal, such as aluminum, nickel, palladium, gold or copper, a metal alloy, a metal stack or an electrically conductive organic material. The contact elements may be situated on the active main surfaces of the semiconductor chips or on other surfaces of the semiconductor chips. The active or passive structures of the semiconductor chips are usually arranged below the active main surfaces and can be electrically contacted via the contact elements.

The devices described in the following may include external contact elements that are accessible from outside of the devices to allow electrical contact to be made from outside of the devices. In addition, the external contact elements may be thermally conductive and serve as heat sinks for heat dissipation of the semiconductor chips. The external contact elements may be composed of any electrically conductive material, for example, a metal such as copper, Pd, Ni, Au, etc.

The devices described in the following may include an encapsulating material covering at least parts of the semiconductor chips. The encapsulating material is an electrically insulating material, which is at most marginally electrically conductive relative to the electrically conductive components of the device. Examples of an encapsulating material include a mold material and an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

The present disclosure provides a smart card module comprising a semiconductor chip having a contact side with a plurality of contacts and a base material with at least one metal layer, wherein the contact side of the semiconductor chip faces the base material and the contacts of the semiconductor chip are electrically connected to the metal layer, and wherein the opposite side of the semiconductor chip and at least a portion of the base material and the metal layer are covered with an encapsulation layer.

In another embodiment, the encapsulation layer of the smart card module completely covers the metal layer and the base material facing the semiconductor chip. As a result, a high robustness smart card module with flexibility in stiffness and a thin thickness of less than 120 µm may be realized. In another embodiment, the encapsulation layer of the smart card module partly covers the metal layer and the base material facing the semiconductor chip.

The encapsulation layer of the smart card module may comprise a plastic layer and a second metal layer. The second metal layer makes it possible to achieve robustness and flexibility in stiffness of the smart card module. The second metal layer may comprise materials such as copper, aluminum, gold, silver. Alternative, the second metal layer may comprise metal alloys. The plastic layer may comprise epoxy resins, polyester, vinyl esters or other thermosetting resins.

In one embodiment, the encapsulation layer of the smart card module may be a resin coated copper foil or a prepreg foil. With the resin coated copper foil, the smart card module becomes more robust and flexible in stiffness. In addition, resin coated copper foil and prepreg foils are materials that can be easily procured in a cost-effective manner.

In one embodiment, the metalized base material of the smart card module may comprise epoxy resin and glass fiber fabric. The metal layer may comprise copper. An adhesive layer may be applied between the contact side of the semiconductor chip and the metal layer applied to the base material. The adhesive layer provides a particularly robust connection of the semiconductor chip to the smart card module.

In another embodiment, a third metal layer may be applied to the non-metalized side of the base material and the first metal layer can be connected to the third metal layer through a plurality of through connections, such as vias. In this way, the semiconductor chip may be contact-connected on its contact-connected side, herein referred to as an underside, opposite the semiconductor chip. This increases robustness and flexibility in stiffness of the smart card module.

Referring to FIGS. 1 and 2, a smart card module is depicted in accordance with one embodiment of the present disclosure. In this embodiment, the smart card module comprises a base material 5 and a first metal layer 3 that is partly disposed over the base material 5. A semiconductor chip 1 is disposed over the first metal layer 3 in a flip chip manner. Semiconductor chip 1 comprises a plurality of contacts (not shown) disposed on its contact side. In one embodiment, the plurality of contacts are electrically connected to the first metal layer 3 by soldering a plurality of contact bumps 2 between the semiconductor chip 1 and the first metal layer 3. Alternatively, an adhesive layer 4 may be applied between the semiconductor chip 1 and the first metal layer 3.

The semiconductor chip 1 may then be encapsulated by an encapsulation layer 6. In one embodiment, the encapsulation layer 6 may comprise a plastic layer 6 and a second metal layer 7 as shown in FIG. 2. Alternatively, the encapsulation layer 6 may be a resin covered copper foil applied by lamination. This foil ensures that breaking forces acting on the smart card module from both sides vary in a comparatively high range. In this embodiment, the encapsulation layer 6 covers at least a portion of the first metal layer 3 and the base material 5. As a result, mechanical loads and premature failures are reduced. In one example, a continuous application of RCC and a through-plating is dispensed, which makes production of the module more cost-effective. As shown in FIG. 2, the second metal layer 7 is disposed over the encapsulation layer 6. The second metal layer 7 provides the advantage of high stability and protects the chip from externally acting forces. An antenna 9 may also be disposed on the metal layer 3.

Referring to FIGS. 3 and 4, a smart card module is depicted in accordance with another embodiment of the present disclosure. In this embodiment, the smart card module comprises a base material 5 and a first metal layer 3 that is partly disposed over the base material 5. A semiconductor chip 1 is disposed over the first metal layer 3 in a flip chip manner. Semiconductor chip 1 comprises a plurality of contacts (not shown) disposed on its contact side 11. In one embodiment, the plurality of contacts are electrically connected to the first metal layer 3 by soldering a plurality of contact bumps 2 between the semiconductor chip 1 and the first metal layer 3. Alternatively, an adhesive layer 4 may be applied between the semiconductor chip 1 and the first metal layer 3.

A third metal layer 8 may be applied to the non-metalized side of the base material 5. The first metal layer 3 is connected to a third metal layer 8 through a plurality of through connections, such as vias 10. By connecting the first metal layer 3 to the third metal layer 8 through a plurality of through connections 10, the semiconductor chip 1 may be contact-connected on its underside. The semiconductor chip 1 may be encapsulated with a resin covered copper foil 6. Unlike the smart card module as illustrated in FIGS. 1 and 2, the encapsulating layer 6 is disposed beyond the boundary of the semiconductor chip 1 over the entire base material 5 facing the semiconductor chip 1. This provides the advantage of a high robustness and flexibility in stiffness to the smart card module because externally breaking forces acting on both sides of the module are distributed. As shown in FIG. 4, a second metal layer 7 is disposed over the encapsulation layer 6. In this example, the second metal layer 7 is also disposed over the entire encapsulation layer 6 beyond the boundary of semiconductor chip 1. This increases robustness and flexibility in stiffness of the smart card module.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A smart card module comprising:
   a base material with at least one metal layer;
   a semiconductor chip disposed over the base material, the semiconductor chip having a contact side with a plurality of contacts, wherein the plurality of contacts are electrically connected to the at least one metal layer;
   an encapsulating layer disposed over the semiconductor chip and at least a portion of the base material and the at least one metal layer; and
   an antenna coil that is disposed over the at least one metal layer.

2. The smart card module of claim 1, wherein the encapsulation layer completely covers the entire base material facing the semiconductor chip.

3. The smart card module of claim 1, wherein the encapsulation layer covers at least a portion of the base material facing the semiconductor chip.

4. The smart card module of claim 1, wherein the encapsulation layer comprises a plastic layer and a second metal layer.

5. The smart card module of claim 1, wherein the encapsulation layer is a resin coated copper foil.

6. The smart card module of claim 1, wherein the base material comprises epoxy resin and glass fiber fabric and wherein the at least one metal layer comprises at least one copper layer.

7. The smart card module of claim 1, further comprising an adhesive layer disposed between the contact side of the semiconductor chip and the base material.

8. A smart card module comprising:
   a base material with at least one metal layer;
   a semiconductor chip disposed over the base material, the semiconductor chip having a contact side with a plurality of contacts, wherein the plurality of contacts are electrically connected to the at least one metal layer;
   an encapsulating layer disposed over the semiconductor chip and at least a portion of the base material and the at least one metal layer; and
   a second metal layer applied to a non-metallized side of the base material.

9. The smart card module of claim 8, wherein the smart card module further comprises an antenna coil that is disposed over the at least one metal layer.

10. The smart card module of claim 8, wherein the at least one metal layer is connected to the second metal layer by a plurality of through connections.

11. The smart card module of claim 8, further comprising a third metal layer disposed over the encapsulation layer.

12. A smart card module comprising:
    a base material having a first side and a second side;
    a first metal layer disposed over the first side of the base material;
    a semiconductor chip disposed over the first metal layer, the semiconductor chip having a plurality of contacts electrically connected to the first metal layer;
    an encapsulation layer disposed over the semiconductor chip; and
    a second metal layer disposed over the encapsulation layer.

13. A smart card module comprising:
    a base material having a first side and a second side;
    a first metal layer disposed over the first side of the base material;
    a semiconductor chip disposed over the first metal layer, the semiconductor chip having a plurality of contacts electrically connected to the first metal layer;
    an encapsulation layer disposed over the semiconductor chip; and
    a third metal layer disposed over the second side of the base material.

14. The smart card module of claim 13, wherein the third metal layer is connected to the first metal layer through a plurality of through connections.

15. A method for producing a smart card module comprising:
    providing a base material with at least one metal layer;
    disposing a semiconductor chip having a plurality of contacts over the at least one metal layer of the base material;

encapsulating the semiconductor chip and at least a portion of the at least one metal layer and the base material with an encapsulation layer; and disposing a second metal layer over the encapsulation layer.

16. The method of claim 15, wherein encapsulating the semiconductor chip and at least a portion of the at least one metal layer and the base material with an encapsulation layer comprises:

encapsulating entirety of the base material and the at least one metal layer with an encapsulation layer.

17. A method for producing a smart card module comprising:

providing a base material with at least one metal layer;

disposing a semiconductor chip having a plurality of contacts over the at least one metal layer of the base material; and encapsulating the semiconductor chip and at least a portion of the at least one metal layer and the base material with an encapsulation layer;

wherein disposing the semiconductor chip over the at least one metal layer comprises soldering a plurality of contact bumps between the plurality of contacts and the at least one metal layer, or disposing an adhesive layer between the at least one metal layer and semiconductor chip.

18. The method of claim 17, further comprising:

disposing a second metal layer over the encapsulation layer.

19. A method for producing a smart card module comprising:

providing a base material with at least one metal layer;

disposing a semiconductor chip having a plurality of contacts over the at least one metal layer of the base material; and encapsulating the semiconductor chip and at least a portion of the at least one metal layer and the base material with an encapsulation layer;

disposing a third metal layer over a non-metallic side of the base material; and connecting the third metal layer with the at least one metal layer through a plurality of through connections.

20. A smart card module comprising:

a base material with at least one metal layer;

a semiconductor chip disposed over the base material, the semiconductor chip having a contact side with a plurality of contacts, wherein the plurality of contacts are electrically connected to the at least one metal layer; and an encapsulating layer disposed over the semiconductor chip and at least a portion of the base material and the at least one metal layer, wherein the encapsulation layer is a resin coated copper foil.

21. A smart card module comprising:

a base material with at least one metal layer, wherein the base material comprises epoxy resin and glass fiber fabric;

a semiconductor chip disposed over the base material, the semiconductor chip having a contact side with a plurality of contacts, wherein the plurality of contacts are electrically connected to the at least one metal layer; and an encapsulating layer disposed over the semiconductor chip and at least a portion of the base material and the at least one metal layer.

22. The smart card module of claim 21, wherein the at least one metal layer comprises at least one copper layer.

23. A smart card module comprising:

a base material with at least one metal layer;

a semiconductor chip disposed over the base material, the semiconductor chip having a contact side with a plurality of contacts, wherein the plurality of contacts are electrically connected to the at least one metal layer;

an encapsulating layer disposed over the semiconductor chip and at least a portion of the base material and the at least one metal layer; and an adhesive layer disposed between the contact side of the semiconductor chip and the base material.

* * * * *